United States Patent [19]

Gakis et al.

[11] Patent Number: 5,572,036
[45] Date of Patent: Nov. 5, 1996

[54] SUPPORT ELEMENT FOR AN AUTOMATIC LOAD PLATFORM OF A SILICON WAFER EXPOSURE UNIT

[75] Inventors: Andreas Gakis; Ralph Busskamp, both of Hamburg, Germany

[73] Assignee: U.S. Philips Corporation, New York, N.Y.

[21] Appl. No.: 492,066

[22] Filed: Sep. 11, 1995

[30] Foreign Application Priority Data

Nov. 23, 1993 [DE] Germany .......................... 43 39 818.9

[51] Int. Cl.⁶ .................................................. H01L 21/68
[52] U.S. Cl. ........................................ 250/453.11; 355/72
[58] Field of Search ......................... 250/453.11, 442.11; 355/72

[56] References Cited

U.S. PATENT DOCUMENTS 4,910,549  3/1990  Sugita ........................................ 355/72
5,044,752  9/1991  Thurfjell et al. ......................... 356/400
5,195,862  3/1993  Cruz ......................................... 414/416
5,374,829  12/1994  Sakamoto et al. ................. 250/453.11

*Primary Examiner*—Jack I. Berman
*Attorney, Agent, or Firm*—Michael E. Schmitt

[57] ABSTRACT

A support element of an automatic load platform of a silicon wafer exposure unit, having a circular cross-section, with a first outer diameter adapted to the guide of a load station, which diameter is smaller than that of a silicon wafer, wherein the circular disc of the support element has at its circumference in a direction parallel to the insertion direction of the load station at least partly enlarged portions and therewith a second outer diameter which corresponds approximately to that of the silicon wafer, and wherein the greatest width of the support element at right angles to the insertion direction corresponds to that of the circular disc.

4 Claims, 1 Drawing Sheet

SUPPORT ELEMENT FOR AN AUTOMATIC LOAD PLATFORM OF A SILICON WAFER EXPOSURE UNIT

BACKGROUND OF THE INVENTION

The invention relates to a support element of an automatic load platform of a silicon wafer exposure unit, which element has a circular cross-section with a first outer diameter which is adapted to the guide of a load station and which is smaller than that of a silicon wafer.

Known automatic load platforms for exposure units such as the UT-stepper of the Ultratech Company, USA, have a circular disc as a support element (chuck) on the load platform whose greatest diameter is smaller than that of the silicon wafer to be exposed. The greatest width of the support element is limited in that case by the width of an insertion slot leading into the load station, i.e. into a station in which the load platform or the support element is loaded with a silicon wafer, which is usually done automatically. After the silicon wafer has been positioned on the load platform, the load platform moves to below an exposure station, which usually comprises a light source and a mask which generates a sharp image on the silicon wafer to be illuminated. Since the silicon wafer projects beyond the edge of the support element, the silicon wafer is supported imperfectly in the edge region, so that it exhibits an overall curvature which leads to a defocusing of approximately 5 to 20 μm at the edge of the silicon wafer. As a result, the rejection rate in the exposure process of such silicon wafers lies at 30 to 40%, which strongly detracts from the manufacturing process.

SUMMARY OF THE INVENTION

The present invention has for its object to provide a support element for an automatic load platform of a silicon wafer exposure unit which renders it possible substantially to avoid a defocusing in a simple manner while using conventional exposure units and load stations.

According to the invention, this object is achieved in that the circular disc of the support element has at its circumference parallel to the insertion direction of the load station at least partly enlarged portions and therewith a second outer diameter which corresponds approximately to that of the silicon wafer, and in that the greatest width of the support element at right angles to the insertion direction corresponds to that of the circular disc.

It was surprisingly found that the load platform, or its support surface, i.e. its support element, which is limited in its dimension sideways by the load station and/or exposure unit, can be so further shaped for silicon wafer, according to the invention, that the rejection rate owing to curvature of silicon wafers can be reduced from the present 30–40% to below 5%.

According to the invention, the support element of the load platform is not changed in its width, but essentially only in its length, so that a load station present, for example with a narrow insertion slot, can also be used with the support element according to the invention without the support element knocking against the insertion slot of the load station or being deformed thereby.

The support element of the load platform enlarged parallel to the insertion direction can be enlarged surprisingly by extremely simple means. It was indeed found that the support element or support surface may be chosen to be partly circular with a smaller diameter than that of the silicon wafer itself, as long as circle sectors enlarge the support surface of the support element in the insertion direction. The annular sectors may also be interrupted in circumferential direction, which corresponds to a special embodiment of the invention.

As experiments have shown, these annular sectors also positively influence the otherwise unsupported edge sideways of the support surface of the support element, so that focusing rejects are reduced to less than 5%.

Further advantageous embodiments of the invention will become apparent from the dependent claims.

BRIEF DESCRIPTION OF THE DRAWINGS

An embodiment of the present invention will be explained in more detail below with reference to a drawing, in which.

DESCRIPTION OF THE PREFERRED EMBODIMENTS

Figure 1:
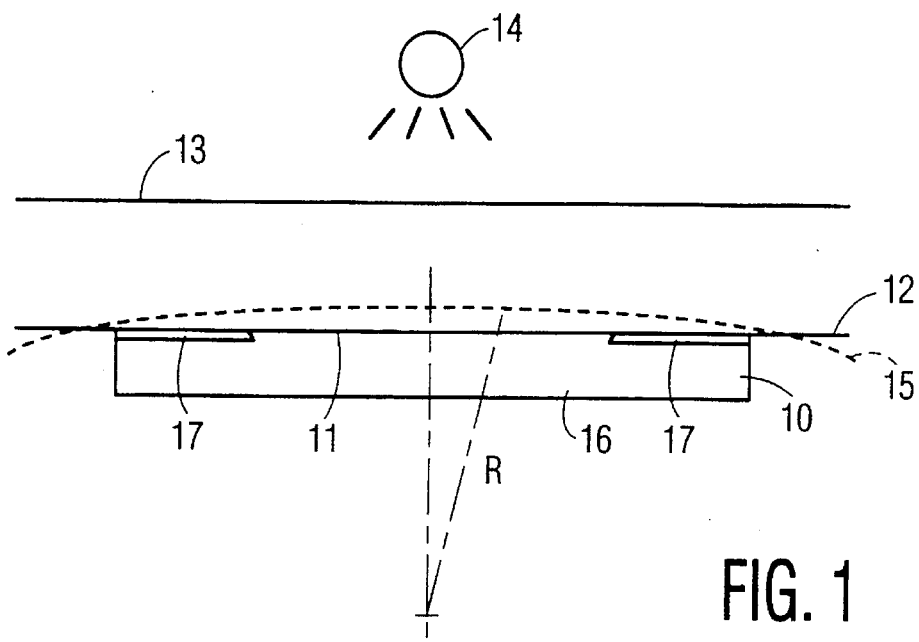
FIG. 1 is a side elevation of a load platform with a support element according to the invention.

FIG. 1 shows a load platform 10 with a support element 11 in side elevation, with an ideally non-curved silicon wafer 12 arranged thereon. A curved silicon wafer 15, such as is to be avoided, is shown with a broken line in order to illustrate the effect of the support element 11 according to the invention compared with the present art.

At some distance above the silicon wafer 12, a mask 13 and above that a light source 14 are arranged in order to illuminate the silicon wafer 12, which is provided with an insulating layer and a photoresist layer (not shown). The load platform 10 moves the silicon wafer 12 into the correct position below the mask 13 in a movement directed towards the plane of the drawing after the load platform 10 has been swivelled sideways in the plane of drawing and has been loaded with the silicon wafer 12 in a load station (not shown) with a movement also directed towards the plane of drawing. After the silicon wafer 12 has been exposed, the load platform 10 is unloaded in a corresponding manner and loaded again.

Figure 2:
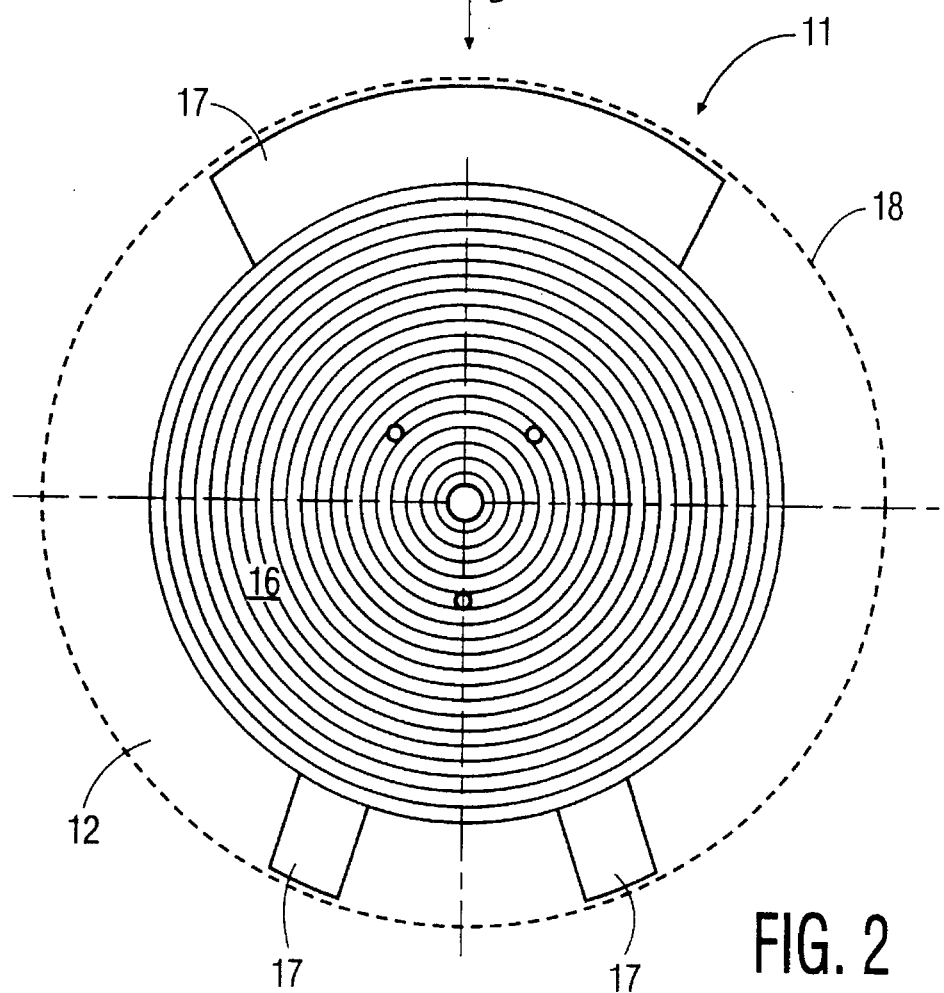
FIG. 2 is a plan view of the support element of the load platform of FIG. 1 according to the invention.

As is shown with a broken line in FIG. 1, a silicon wafer 15 exhibits a curvature with a radius R on a support element which is merely circular, corresponding to the disc 16 in FIG. 2, as is known in the present art, because the wafer projects beyond the edge of the disc 16 of the support element, which leads to defocusing, especially in the edge region of the silicon wafer 15. The support element 11 according to the invention has portions 17 at the circular disc 16 which do prolong the support element 11 parallel to the insertion direction, but do not widen it at right angles thereto. The silicon wafer 12 in this case exhibits no curvature R.

FIG. 2 is a plan view of a support element 11 according to the invention which can be moved in the direction of arrow B, for example, to below the mask 13 of an exposure unit, but also into an insertion slot of conventionally limited width of a load station (not shown). The support element 11 according to the invention has for this purpose a central circular disc portion 16 whose diameter, as in the present art, is smaller than that of the silicon wafer 12. In the direction of arrow B, i.e. parallel to the insertion direction of the load station or exposure unit, the support surface of the support element 11 according to the invention has portions 17 in the form of sectors of circular rings, which increase the support surface on the diameter of the silicon wafer 12 in the direction of arrow B. It is safeguarded thereby that the support element 11 according to the invention can be used with an increased support surface in a conventional load station or exposure station, while at the same time supporting a major portion of the edge of the silicon wafer 12.

As a result, no curvature of the silicon wafer 12 occurs in the regions of the portions 17 at all, and surprisingly does not occur anymore in the edge regions which are not additionally supported either, in FIG. 2 to the left and right of the disc 16. It may also be so arranged that the portion 17, as shown in the bottom half of FIG. 2, is subdivided. A support surface of this shape of a support element 11 according to the invention has a rejection rate of below 5%. The broken line 18 in FIG. 2 indicates the outer edge of a silicon wafer 12.

The characteristics of the invention disclosed in the above description, in FIGS. 1 and 2, and in the claims may be essential singly or also in any combination for realising the various embodiments of the invention.

We claim:

1. A support element of an automatic load platform of a silicon wafer exposure unit, which element has a circular cross-section with a first outer diameter which is adapted to the guide of a load station and which is smaller than that of a silicon wafer, characterized in that the circular disc of the support element has at its circumference parallel to the insertion direction of the load station at least partly enlarged portions and therewith a second outer diameter which corresponds approximately to that of the silicon wafer, and in that the greatest width of the support element at right angles to the insertion direction corresponds to that of the circular disc.

2. A support element as claimed in claim 1, characterized in that the portions which enlarge the circular central disc are sectors of a circular ring.

3. A support element as claimed in claim 2, characterized in that the portions in the form of sectors of a circular ring are subdivided at least once in circumferential direction.

4. A support element as claimed in claim 2, characterized in that the support surface of the support element, comprising the central disc and the portions in the shape of sectors of a circular ring, forms an exchangeable accessory of a load platform.

* * * * *